United States Patent
Riad

[11] Patent Number: 5,886,597
[45] Date of Patent: Mar. 23, 1999

[54] CIRCUIT STRUCTURE INCLUDING RF/ WIDEBAND RESONANT VIAS

[75] Inventor: Sedki M. Riad, Blacksburg, Va.

[73] Assignee: Virginia Tech Intellectual Properties, Inc., Blacksburg, Va.

[21] Appl. No.: 825,382

[22] Filed: Mar. 28, 1997

[51] Int. Cl.$^6$ .................................. H01P 3/08; H05K 1/00
[52] U.S. Cl. ......................... 333/245; 333/219; 333/247; 174/250; 361/734
[58] Field of Search ...................................... 333/247, 246, 333/260, 245, 219; 257/691, 276, 277, 532; 174/250, 255, 262, 264; 361/734, 736

[56] References Cited

U.S. PATENT DOCUMENTS

| | | | |
|---|---|---|---|
| Re. 35,064 | 10/1995 | Hernandez | 361/763 |
| 4,706,162 | 11/1987 | Hernandez et al. | 361/306 |
| 4,739,448 | 4/1988 | Rowe et al. | 333/247 X |
| 5,023,579 | 6/1991 | Bentivenga et al. | 333/203 |
| 5,272,590 | 12/1993 | Hernandez | 361/306.2 |
| 5,304,967 | 4/1994 | Hayashi | 333/206 |
| 5,354,599 | 10/1994 | McClanahan et al. | 428/209 |
| 5,396,397 | 3/1995 | McClanahan et al. | 361/313 |
| 5,446,430 | 8/1995 | Yamanaka et al. | 333/202 |
| 5,451,917 | 9/1995 | Yamamoto et al. | 222/246 |
| 5,475,264 | 12/1995 | Sudo et al. | 257/723 |
| 5,499,445 | 3/1996 | Boyle et al. | 29/830 |
| 5,509,200 | 4/1996 | Frankeny et al. | 29/852 |
| 5,528,209 | 6/1996 | Macdonald et al. | 333/247 |
| 5,635,767 | 6/1997 | Wenzel et al. | 257/691 X |
| 5,689,216 | 11/1997 | Sturdivant | 333/260 X |
| 5,723,823 | 3/1998 | Bell | 174/250 X |
| 5,726,863 | 3/1998 | Nakayama et al. | 174/255 X |

*Primary Examiner*—Seungsook Ham
*Attorney, Agent, or Firm*—Whitham, Curtis & Whitham

[57] ABSTRACT

A resonant via-type connection between layers of a multi-layer support structure having, at predetermined RF frequencies, a very low, effectively short circuit impedance. The resonant vias utilize the inductance of a via post by forming it into a resonant circuit with a capacitance at the via's distal end coupled to another conductor. A plurality of resonant vias can be formed having respective plurality of resonant frequencies to form a wideband connection. The capacitances at the vias' distal ends coupling to another conductor can be formed to resonate with the total series inductance of the via post and of wire connections to an attached device.

22 Claims, 6 Drawing Sheets

CIRCUIT STRUCTURE INCLUDING RF/WIDEBAND RESONANT VIAS

FIELD OF THE INVENTION

The present invention relates to an interconnection of electronic components on circuit boards and on other support structures and, more particularly, to an interconnect system using resonant vias for grounding and signal connections.

DESCRIPTION OF THE RELATED ART

Multilayer support structures for electronic components are well known. Examples of known support structures include multiple wiring layer printed circuit boards, multi-chip modules (MCMs) and high density multichip modules (HDMIs) employing multiple wiring layer substrates, and multiple wiring layer single integrated circuits (ICs). The wiring layers are separated from one another by dielectric materials such as, for example, phenolic resin, epoxy, ceramic, silicon, silicon dioxide or polyimide.

A conventional method for electrically connecting one wiring layer to another, i.e., "interlayer connection," is by a perpendicular conductive through-via extending from one layer, through the dielectric, to the other layer. The other layer may be, for example, a signal layer or a ground layer. There are various specific structures for the interconnection, and these are selected based, for example, on the particular support structure, the number of wiring layers, and the number of the wiring layers connected by the specific via.

An example interlayer connection used for an HDMI is shown by U.S. Pat. No. 5,485,038 to Licari et al., wherein, with reference to the numerals defined in Licari, a metallization 54 on a top dielectric layer 38 connects by a plated-hole via 42 and 46 to metallization 28 and 36 on a second dielectric layer 14, and to a deeper metallization layer employing via 18. The wires 66 and 68 carry signals, and connect to power supply and ground conductors in the substrate 10. It is seen that the via 18, 42 and 44 connections are direct coupled (DC).

FIG. 1 of the present application depicts a grounding scheme using such conventional through vias as identified above. For ease of description, the dielectric layers are not shown. As can be seen, there is a main ground 2, a second ground layer 4, and a plurality of vias 6 connect the two layers.

There is a need that has been identified by the present inventor, however, for a structure and method for a low impedance alternating current (AC), type of interlayer coupling, which is not met by the connecting through-vias of the prior art. More particularly, there is a need for a practical, readily fabricated, low impedance radio frequency (RF) operating range interlayer connection.

The identified need arises, in part, from the inherent inductance of conventional connecting through-vias. At RF frequencies, especially at frequencies greater than approximately 1 GHz, the via inductance may impose a substantial impedance. This can be especially troublesome for through-vias connecting to a ground plane. The effect, which is known to one of ordinary skill in the art outside of the context of this invention, is that a conductor layer which is desired to be connected to ground by the via is, in actual operation, isolated by the via inductance and, hence, not well grounded.

A first shortcoming with prior art apparatus and methods is that none operate as a short circuit at RF frequencies.

Another shortcoming with prior art methods is that each employs components which are separate and additional relative to the through-vias, thereby consuming additional volume within the structure and requiring additional manufacturing steps.

Yet another shortcoming with prior art methods, is that the buried components frequently have a substantially different form and structure than the through-vias, thereby complicating the overall structure of the device.

SUMMARY OF THE INVENTION

An object of the present invention is to provide a connection between layers of a multilayer support structure having, at a predetermined RF frequency, a very low impedance, effectively functioning as a short circuit.

Another object of the present invention is to provide a low impedance interlayer connection which is readily implemented as a regularly formed structure formed of practical modifications and combinations of known conventional structures and manufacturing methods.

Still another object of the present invention is to provide an apparatus and method for connection between layers of a multilayer support structure which both utilizes the inherent inductance of a through-via, and compensates for that inductance, by combining it into a resonant circuit.

The present invention attains these and other objects with a capacitor plate positioned at, for example, the via's distal end, spaced apart a certain distance from the coupled conductor plane by an interlayer dielectric. By a particular and defined arrangement and dimensioning of the capacitor plate, the series reactive impedance, at a predetermined resonant RF frequency, produced by the via inductance and the via terminating capacitor is zero, thereby providing an RF short circuit between the respective conductor layers.

Still another object of the present invention is to provide a system of interlayer connections, where a first connection is an RF short at a first predetermined, or resonant, RF frequency and another connection is a short circuit at a second resonant frequency. This object is accomplished by, for example, forming the terminating capacitor plates of respective vias to have different dimensions relative to one another.

Another object of the present invention is to provide connections between two or more layers of a multilayer support where each of a plurality of connections operates as a short circuit between a corresponding one or more layers at a corresponding RF frequency.

Still another object of the present invention is provide interconnections between two or more layers of a multilayer support, where one of the connections is by conventional through-via, and other connections are by the present inventive resonant vias.

Another object of the present invention is to form a resonant interlayer coupling circuit with only a via using the capacitance between the vials distal end and the coupled conductor, without an additional capacitor plate at that distal end.

Still another object of the present invention is to form a resonant via interlayer connection in which the via-tip-to-ground layer capacitance is selected to form a resonant circuit with the total inductance of the perpendicular via post in series with the wire bonds and solder pads connecting the via to an electronic component.

BRIEF DESCRIPTION OF THE DRAWINGS

The foregoing and other objects, aspects, and advantages will be better understood from the following description of preferred embodiments of the invention with reference to the drawings, in which.

DETAILED DESCRIPTION OF THE PREFERRED EMBODIMENTS

Figure 2:
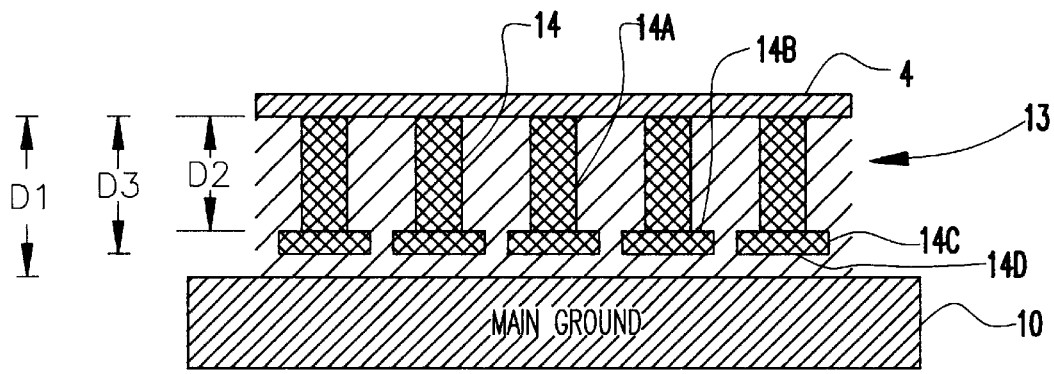
FIG. 2 depicts a general example of the present invention, implementing a grounding scheme by a plurality of resonant vias.

FIG. 2 shows a general embodiment of the present invention, comprising a main ground 10, a parallel second ground conductor 12 spaced above the main ground a distance D1 by a dielectric 13, and a plurality of resonant vias 14. Each resonant via 14, for this example, comprises a via post 14a extending a length D2 from a first surface 14b of the capacitor plate 14c to the second ground conductor 12. The second surface 14d of the capacitor plate 14b is spaced a distance D3 from the top surface 10a of the main ground 10.

The capacitor plate 14c has a diameter AD, and the via post 14a has a diameter P. The capacitor plate 14c has an area A (not shown), which is determined by the diameter AD and the form of the plate viewed from a direction normal to the main ground 10. The form of the plate 14c is preferably circular, but may have other shapes such as, for example, rectangular or hexagonal. The form of the capacitor plate 14c, although not always critical, will of course affect the RF characteristics of the via 14 and should be accounted for in the computer simulation phase of the design, as will be understood from the description below.

Figure 3:
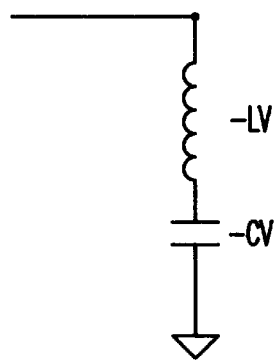
FIG. 3 shows an equivalent circuit model of a resonant via according to the present invention.

A simplified, lumped parameter type model of the via 14 and proximal conductor area of the main ground 10 is shown in FIG. 3. The FIG. 3 model comprises an inductor LV, which models the inductance of the via post 14a, and a capacitor CV, which models the capacitor formed by the capacitor plate 14b spaced a distance D3 from the top surface of the main ground plane. The value of CV, as can be understood by one of ordinary skill in the art, is determined by the diameter AD of the capacitor plate 14b, the distance D3, and the dielectric constant ED of the dielectric material 13 between the plate 14b and the main ground 10.

As stated above, the FIG. 3 model is a simplified lumped parameter model and, for this example, neglects the real resistance of the via post 14a, the conductivity of the dielectric material (not shown), and other various cross-coupling capacitances between the via 14 and its neighboring structures. The FIG. 3 model, however, can be easily modified, using any of the various well-known modeling methods and available software tools, to include such "second order effects" and, further, can be formed as a distributed parameter model. The specific simulation model that is used is a design choice based, in part, on the vias' frequency of operation, as well as on user preference.

Based on the FIG. 3 model, the impedance Z of the via 14, in terms of the frequency W, is:

$$abs(Z) = abs(1 - W^2 * LV * CV) \qquad \text{Eq. (1)}$$

It should be noted that Eq. (1) can be readily modified to include whatever second order effects that the designer adds to the FIG. 3 model.

Referring to Eq. (1), it is seen that abs(Z) is equal to zero at $W = (LV*CV)^{-\frac{1}{2}}$, which is termed $W_0$, or the resonant frequency. The frequency $W_0$ is set by selecting values of LV and CV. Therefore, as can be seen, the FIG. 2 embodiment provides RF grounding for the second ground 12 to the main ground plane 10 at the resonant frequency $W_0$. $W_0$ could, for example, be the center frequency of a bandpass filter.

The value of the via inductance LV is calculated using standard simulation and circuit analysis tools, and is based on the form and physical dimensions of the via 14, the dielectric constant of the interlayer dielectric 13 and other physical parameters, depending on the particular variation of the FIG. 3 model selected.

The value of CV is then obtained from Eq. (1) by substituting zero for Z and rearranging terms to:

$$CV = 1/W_0^2 * LV \qquad \text{Eq. (2)}$$

CV can be set to the Eq. (2) value by adjusting the diameter AD, and hence the area A, of the capacitor plate 14c, the spacing D3, and/or by choosing the dielectric constant of the interlayer dielectric 13. It is the combination of A and D3 which determines CV and, therefore, their particular values are a design choice. However, the various RF criteria and tradeoff factors that should be weighed in selecting A and D3 are well known by one of ordinary skill in the art.

Figure 4:
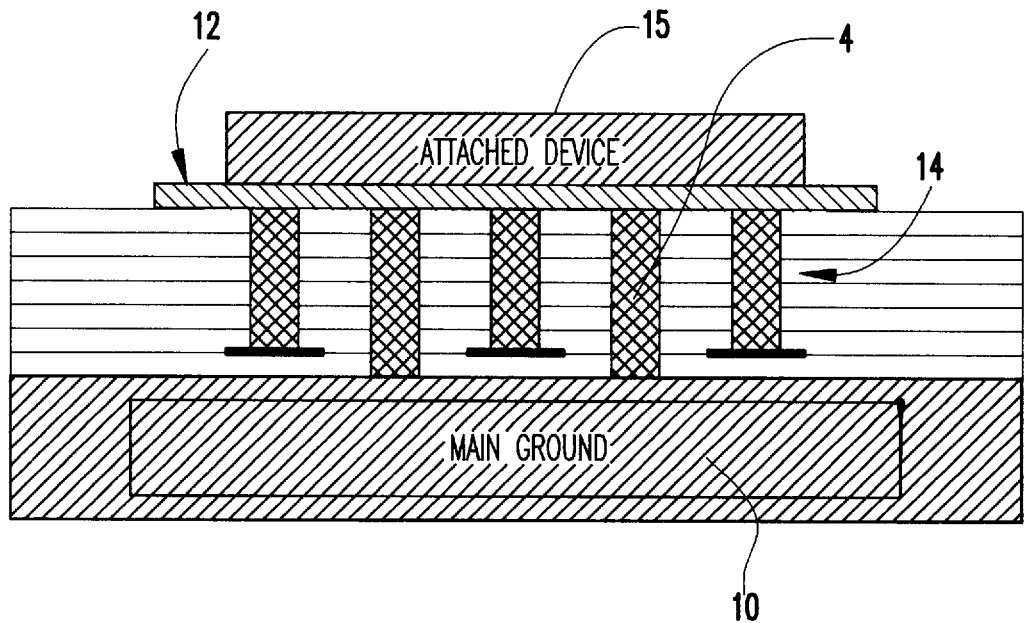
FIG. 4 shows another embodiment of the present invention, having a combination of the resonant vias of FIG. 2 with conventional through-vias.

FIG. 4 shows another embodiment of the present invention, using a combination of the resonant vias 14 of FIG. 2 and conventional through-vias 4. An attached device 15 is shown for illustrative purposes.

Figure 5:
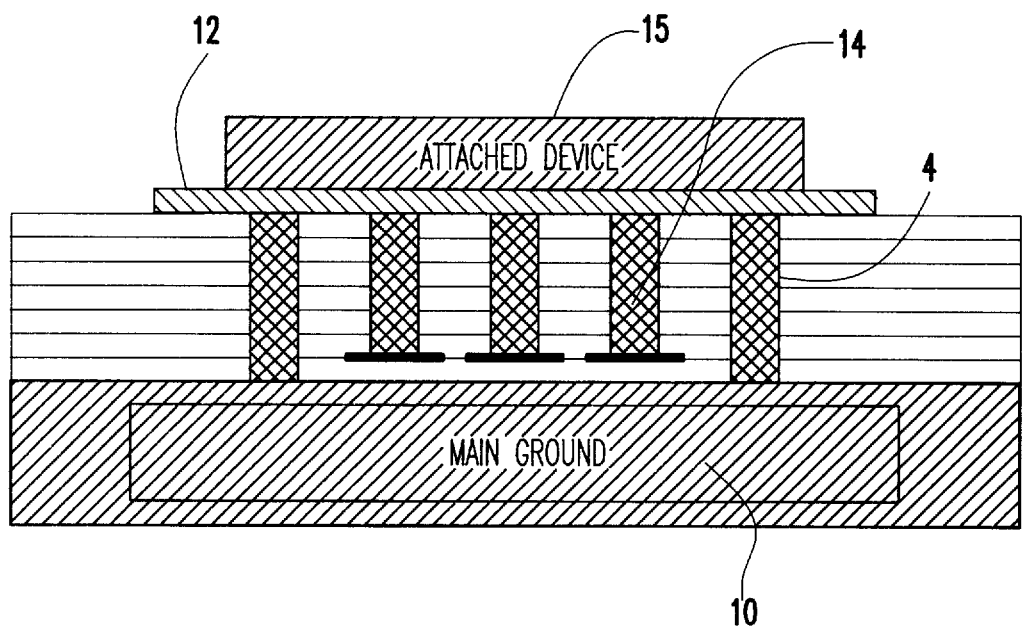
FIG. 5 shows a variation of the FIG. 4 embodiment, having a different combination and arrangement of conventional and resonant vias.

FIG. 5 is a variation of the FIG. 4 embodiment showing an example of a different combination and arrangement of conventional vias 4 and resonant vias 14.

Figure 6:
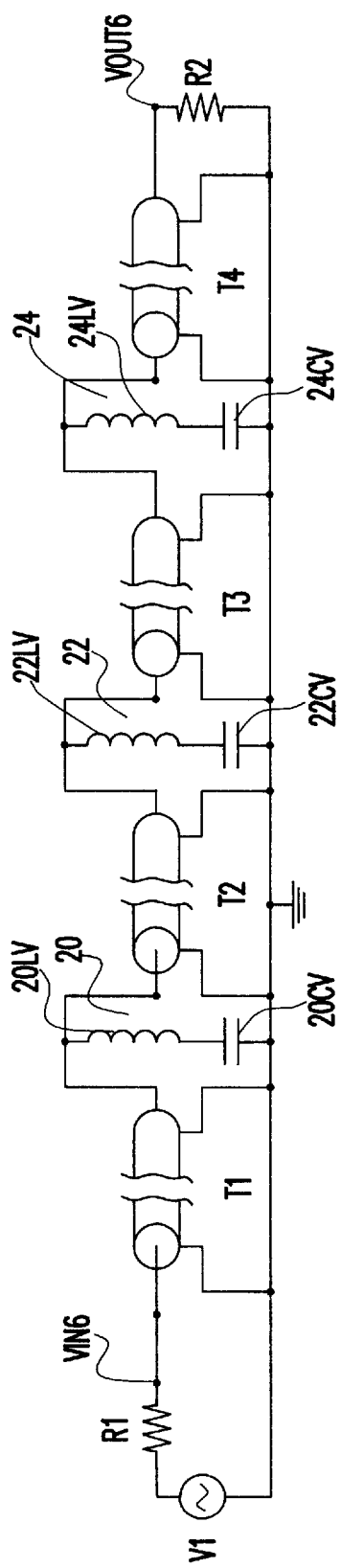
FIG. 6 shows another embodiment, represented by a computer simulation model, having three resonant grounding vias.

Still another embodiment of the present invention, which is shown by a computer simulation model in FIG. 6, comprises three resonant vias, labeled 20, 22, and 24, having three different resonant frequencies $W_{20}$, $W_{22}$ and $W_{24}$.

Figure 1:
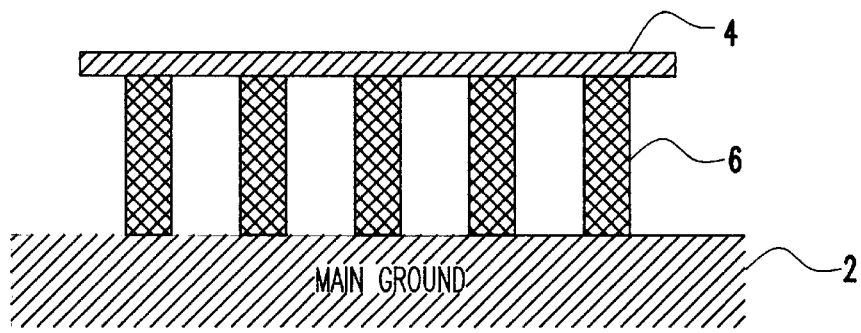
FIG. 1 shows a grounding scheme of a multilayer support using conventional through-vias.

The resonant vias 20, 22, and 24 comprise, respectively, via posts modeled as 20LV, 22LV and 24LV and, capacitors modeled as 20CV, 22CV and 24CV coupling the vials distal end to ground. The transmission lines T1, T2, T3 and T4 model the conduction path within a second conductor, such as conductor 12 of FIG. 1. Elements V1 and R1 model the voltage source, and R2 models the load resistance. For the example model, R1=R2=50 ohms. The reference points VIN6 and VOUT6 are for simulation of the circuit's scatter matrix, or S-parameters, which will be described further below.

For the FIG. 6 model, each of 20LV, 22LV and 24LV were set at 150 pH, and 20CV=0.75 pF, 22CV=1.0 pF, and 24CV=1.25 pF.

The three different capacitances, 20CV, 22CV and 24CV can be obtained by, for example, three different spacings between the vias' respective capacitor plate (not shown) and the main ground (not shown). Alternatively, the capacitor plates could be formed with three different respective areas.

Figure 7:
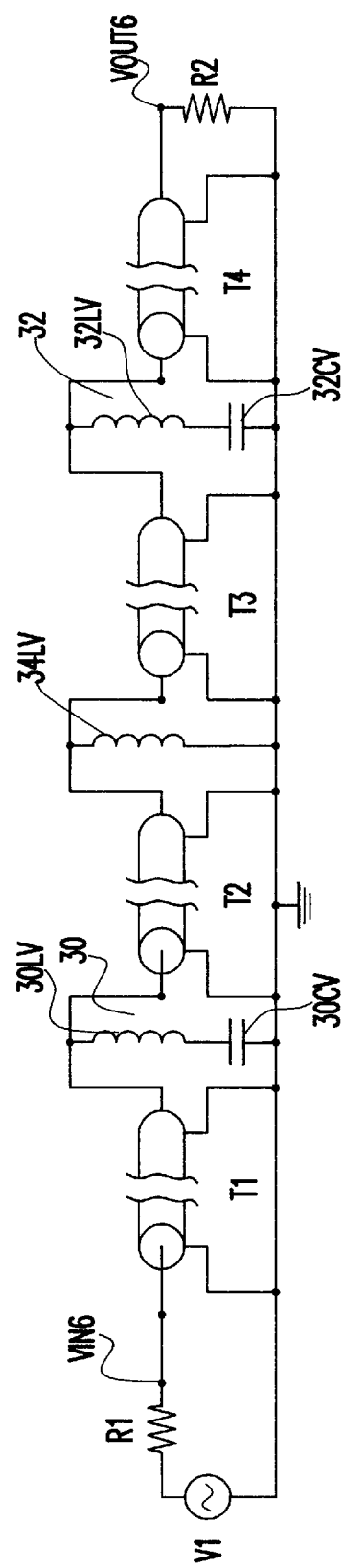
FIG. 7 shows a further embodiment, represented by a computer simulation model, having two resonant grounding vias and one conventional through-via.

An example of the embodiments of FIGS. 4 and 5 shown by a computer simulation model in FIG. 7, is an RF grounding scheme having two resonant grounding vias 30 and 32, having corresponding resonant frequencies $W_{30}$ and $W_{32}$, defined by Eq. (1) hereinabove, and one conventional via modeled as inductor 34LV. The resonant vias 30 and 32 comprise, respectively, via posts modeled as 30LV and 32LV, capacitors modeled as 30CV and 32CV coupling the via's distal end to ground.

For the FIG. 7 example, each of 30LV and 32LV were set at 150 pH. The value of the inductor 34LV modeling the conventional through-via is 200 pH, with the value being larger than 30LV and 32LV because of the physical through-via's (not shown) longer length. The value of 30CV was set at =0.75 pF and 32CV at 1.25 pF.

Figure 8:
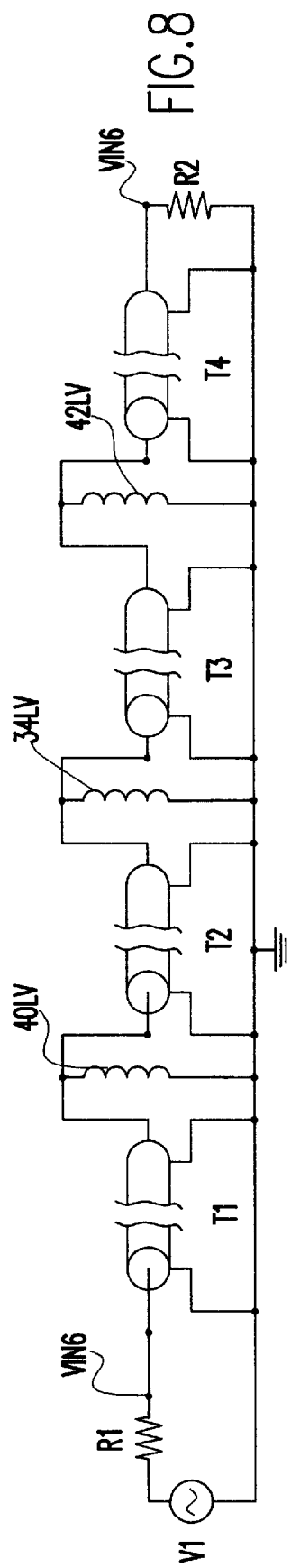
FIG. 8 shows a simulation model of a comparative example conventional RF grounding scheme using conventional through-vias.

FIG. 8 shows a conventional grounding scheme, which is used as a comparative example for the S-parameter simulations of FIGS. 6 and 7, shown in FIG. 9 and described below. The FIG. 8 model replaces the resonant vias 30 and 32 of FIG. 7 with through-vias, modeled as inductors 40LV and 42LV connected directly to ground. The inductances of 40LV and 42LV are set at 200 pH, which is the value of the conventional through-via 34LV of the FIG. 7

Figure 9:
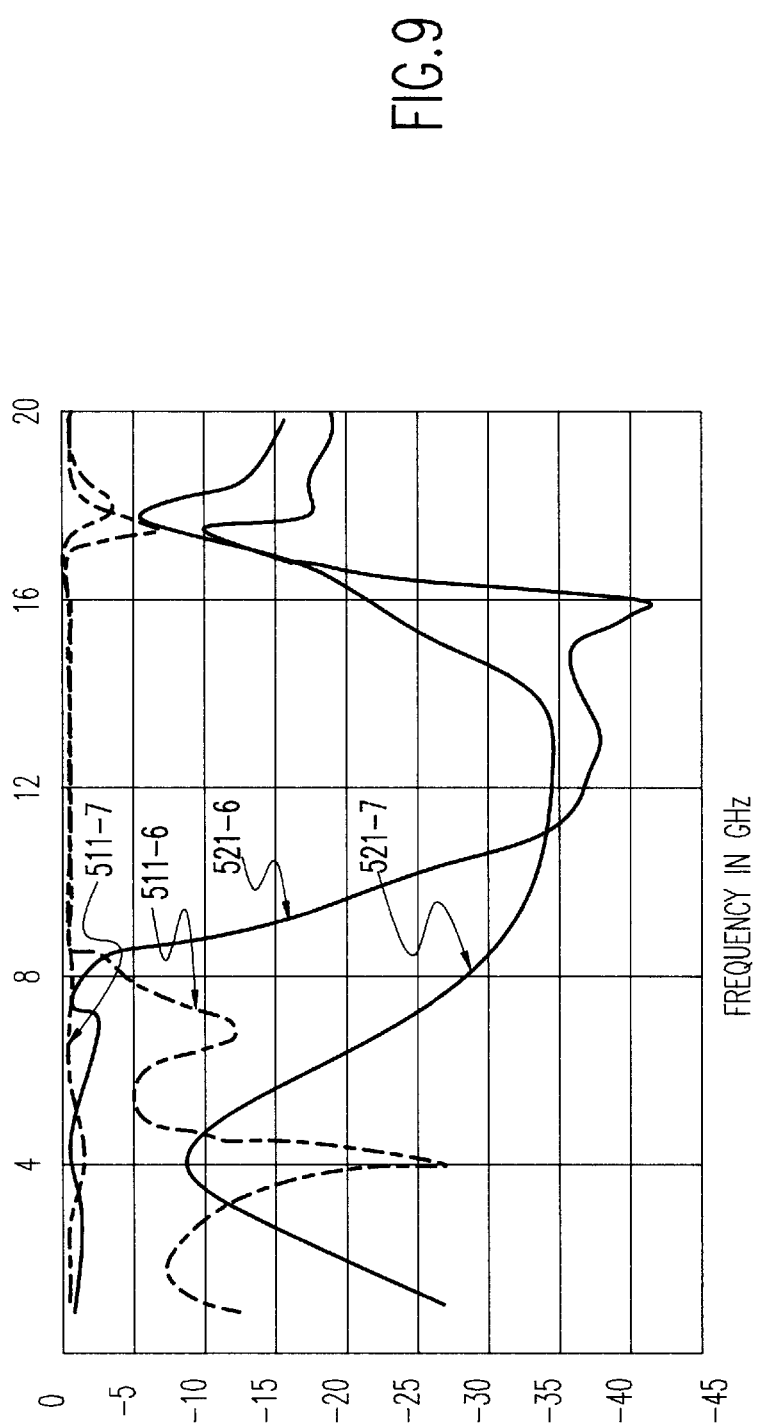
FIG. 9 shows a computer simulation of the S-parameters versus frequency for the embodiments of FIGS. 6 and 7, and the conventional scheme of FIG. 8.

FIG. 9 shows a superimposed-plot computer simulation of the S-parameters versus frequency for the embodiments of FIGS. 6 and 7, and the conventional grounding scheme of the FIG. 8 model. Plot lines S11-6 and S21-6 show the S11 and S21 parameters of the scattering matrix for the FIG. 6 embodiment. The definition of the scattering matrix is well known in the art and described in many available treatises.

Plot lines S11-7 and S21-7 represent the S11 and S21 parameters of the scattering matrix for the FIG. 7 embodiment. The dB (20Log$_{10}$) improvement in the scattering matrix values for the FIG. 6 embodiment and the FIG. 7 example, compared to the conventional grounding scheme of FIG. 8, is readily seen from the vertical dB axis.

Figure 10:
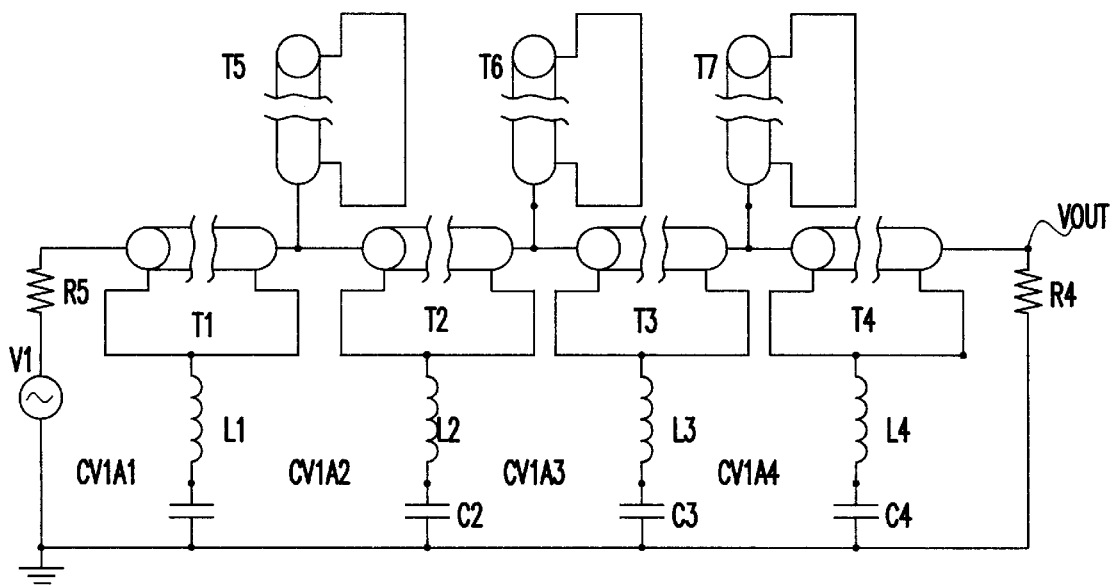
FIG. 10 shows a simulation model of an RF filter formed on a multilayer support, having resonant grounding vias, with a plurality of resonant frequencies.

FIG. 10 shows a computer simulation model of an RF filter using the resonant vias of the present invention, comprising a signal source V1, an equivalent source resistance R5, a load resistor R4, and four resonant grounding through-vias, labeled as CVIA1, CVIA2, CVIA3 and CVIA4, with the within-layer conductors modeled as transmission lines T1–T6. The vias consist, respectively, of L1 and C1, L2 and C2, L3 and C3, and L4 and C4. The inductors L1, L2, L3 and L4 are, for this example, set at 0.4 nH, to model via posts such as 14a of FIG. 2. The capacitors C1, C2, C3 and C4 model via capacitor plates such as 14c of FIG. 2.

For this example, resonant via CVIA1 was set to resonate at approximately 15.915 GHz for which a C1 capacitance of 0.25 pF was chosen. Resonant vias CVIA2, CVIA3 and CVIA4, for this example, were chosen to resonate at approximately 7.958 GHz, for which the 0.5 pF value of C2, C3 and C4 was chosen. The output point is labeled as VOUT.

Figure 11:
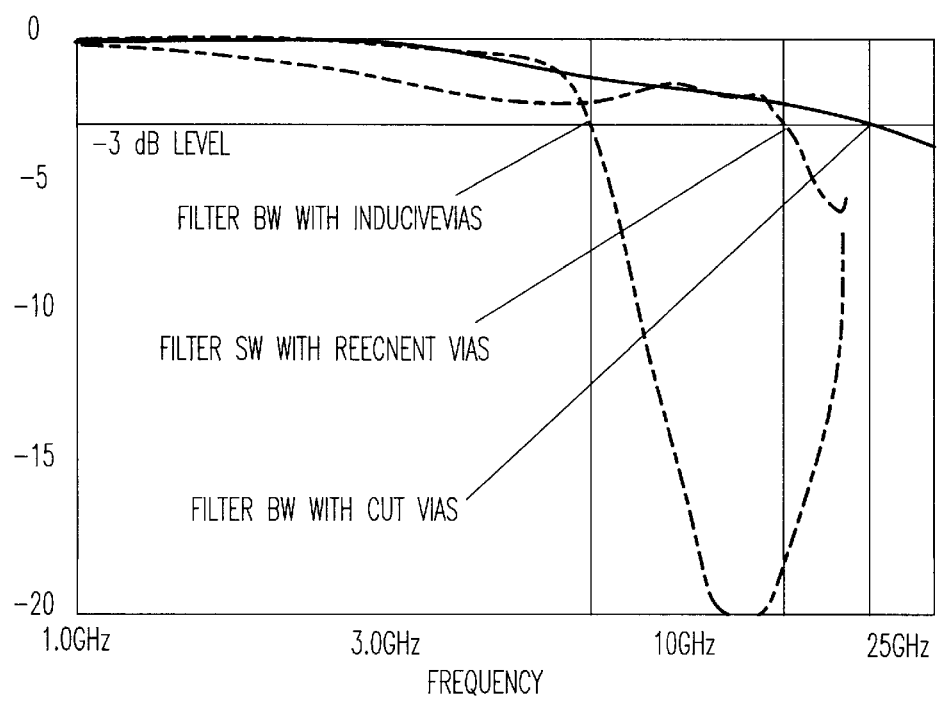
FIG. 11 shows a computer generated simulation plot comparing a frequency response of the FIG. 10 embodiment with that of a conventional through-via RF filter.

FIG. 11 is a computer generated plot comparing, VOUT verses frequency for the FIG. 10 embodiment with the same embodiment but with each of the resonant vias replaced by a conventional through-via (not shown). This is obtained from the FIG. 10 model by connecting the lower end of the 0.4 nH inductances directly to the ground plane. The S-paramater plots for the FIG. 10 embodiment are S11-R and S21-R and the conventional through-via plots are labeled as S11-C and S21-C.

All example embodiments of the invention, as described above, have been shown with only two planes connected with resonant vias. Further embodiments, however, are contemplated.

Figure 12A:
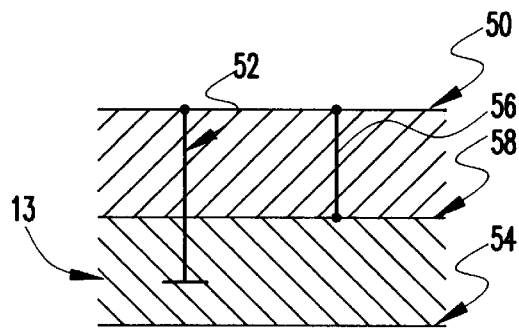
FIGS. 12a–12d show variations of the FIG. 2 embodiment, with pluralities of layers connected in various combinations by resonant vias and conventional through-vias.

More particularly, FIG. 12a shows an example of a top conductor 50 connected by a resonant via 52 to a bottom conductor 54, where 54 could, for example, be a ground plane, and by a conventional via 56 to a center plane conductor 58.

Figure 12B:
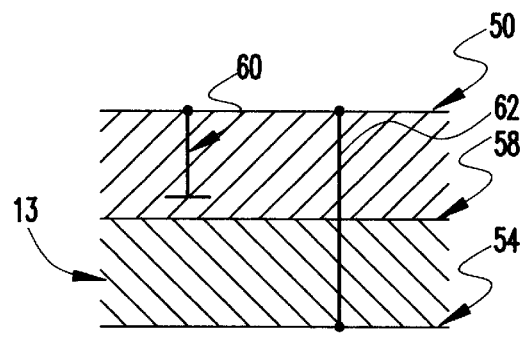

FIG. 12b shows a variation of the FIG. 12 embodiment, having the top conductor 50 connected by a resonant via 60 to the center plane conductor 58 and by a conventional via 62 to the bottom conductor 54.

Figure 12C:
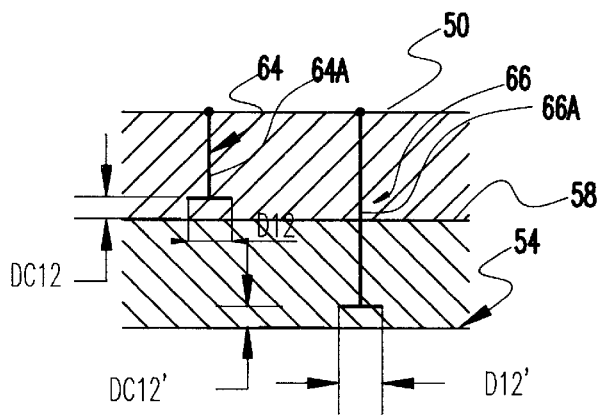
Figure 12D:
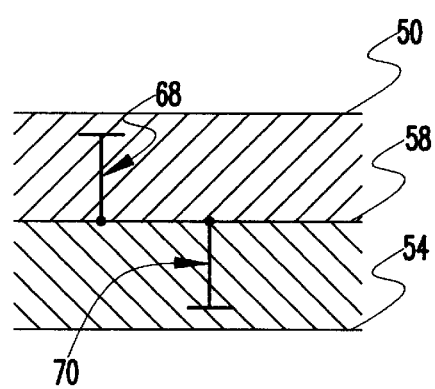

FIGS. 12c and 12d show still further embodiments of the present invention, where FIG. 12c shows a top conductor 50 connected by a first resonant via 64 to the center plane conductor 58, and connected by a second resonant via 66 to the bottom conductor 54. The diameters D12 and D12' and distances DC12 and DC12', and hence the capacitances, are selected based on the inductance of via posts 64a and 66a, which are different if their respective lengths DV12 and DV12' are different, and based on the intended resonant frequencies of 64 and 66. The FIG. 12d embodiment is a further variation, having the center plane conductor 58 connected to the top layer 50 by a first resonant via 68 and to the bottom layer 54 by a second resonant via 70.

Figure 13:
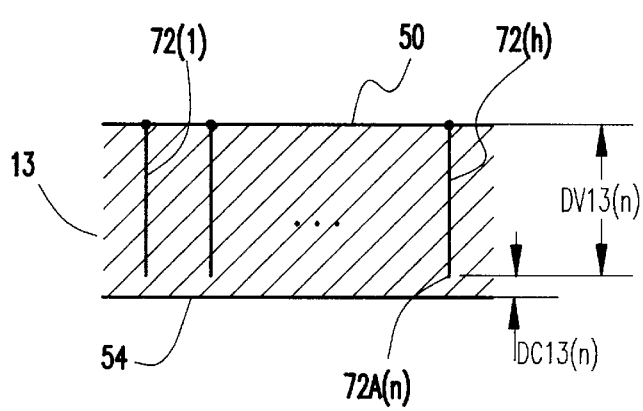
FIG. 13 shows a still-further embodiment of this invention, having resonant vias extending from a top conductor and terminating above a bottom conductor, without a discrete capacitor plate at the vias' distal end.

Still another embodiment of the invention is shown in FIG. 13. This embodiment comprises a plurality of N resonant vias 72(n) n is an integer, greater than or equal to 1, each extending down from the top conductor 50 a distance DV13(n) to a distal end 72a(n) and spaced DC13(n) from the bottom conductor 54, without having an extended area capacitor plate at that distal end. This embodiment does not have a capacitor plate at the distal end 72a(n) because the capacitance effected by the bottom-facing surface (not numbered) of the distal end 72a(n) and the facing area of the bottom conductor 54, for some applications such as millimeter wave RF, can be sufficient for the via to resonate at the desired frequency. For tuning of the resonance, the distance DC13(n), the diameter (not labeled) of the via 72(n), plating and other physical parameters (not shown) of the via 72(n), and the interlayer dielectric material 13 can be varied to obtain an inductance LV and capacitance CV, referring to the FIG. 3 model, for the desired resonant frequency.

Figure 14:
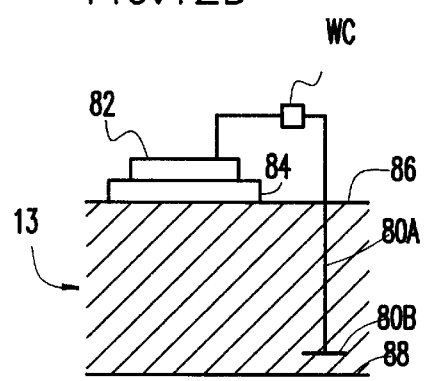
FIG. 14 shows a further embodiment of the present invention implementing a ground for an attached device, with a resonant via connection incorporating an inductance of the via post in series with device's wire bonds.

FIG. 14 depicts a further embodiment of the present invention which both utilizes and, at the same time, compensates for not only the via post 80a inductance but, in addition, the wire bonds and other series connections, shown as a lumped element WC, connecting the via post 80a to an electronic device 82 arranged, on an insulating layer 84, on the top conductor 86. For this embodiment, capacitor plate 80b and the distance WD from the bottom conductor 88 are dimensioned such that the capacitance realized by 80b, the dielectric layer 13 and the bottom conductor 88 effects a resonant circuit with the total inductance of the via post 80a in series with the wire bonds and solder pads, represented as WC. For high RF applications, the capacitor plate 80b might be omitted, as discussed for the embodiment of FIG. 13.

The present invention has been described in reference to specific and exemplary embodiments. As seen by one of ordinary skill, however, there are many alternative embodiments of this invention which are within the spirit and meaning of the description above and within the scope appended claims.

I claim:

1. A resonant interlayer element in a support structure, said element comprising:
   a dielectric member having a first ground conductor arranged in a first plane, and having a second ground conductor arranged in a second plane, said second ground conductor spaced apart from said first ground conductor a distance D1 in a direction normal to said first plane; and
   a conducting via connected to the first ground conductor and extending a distance D2 in said normal direction toward said second ground conductor and terminating at a first distal end, where D2 is less than D1, whereby said conducting via forms a series LC between said first ground conductor and said second ground conductor, said conducting via shorting said first ground conductor to said second ground conductor at a predetermined resonant frequency.

2. A support structure as recited in claim 1 wherein the series LC has an inductance L1, a capacitance formed between said first distal end and the second ground conductor having a value of C1 farads, where C1 is such that an L1C1 structure is formed having an impedance essentially equal to zero at said predetermined resonant frequency W0.

3. A support structure according to claim 2, said element further comprising a plate connected to said first distal end having an area A dimensioned to achieve the capacitance C1 farads.

4. A support structure according to claim 2, said element further comprising a plate connected to said first distal end, said plate spaced a distance D3 from said second ground conductor D3 to achieve the capacitance C1 farads.

5. A multilayer support according to claim 1 further comprising a second conducting via connected to said first ground conductor and to said second ground conductor.

6. A multilayer support according to claim 1, further comprising:
   a third conductor arranged in a third plane between said first plane and said second plane and spaced from said first plane a distance D4 in said normal direction; and
   a second conducting via connected to said first ground conductor and to said third conductor.

7. A multilayer support according to claim 1, further comprising a second resonant interlayer element, said second resonant interlayer element comprising:
   a third conductor arranged in a third plane spaced from said first plane and between said first plane and said second plane;
   a second conducting via connected to said first ground conductor and extending toward said third conductor to a second distal end spaced apart from said third conductor, whereby said second conducting via forms a second series LC between said first ground conductor and said third conductor, said second conducting via shorting said first ground conductor to said third conductor at a predetermined second resonant frequency.

8. A multilayer support according to claim 2, further comprising a second resonant interlayer element, said second resonant interlayer element comprising:
   a third conductor arranged in a third plane between said first plane and said second plane and spaced from said first plane; and
   a second conducting via connected to said first ground conductor and extending toward said third conductor to a second distal end spaced apart from said third conductor, whereby said second conducting via forms a second series LC between said first ground conductor and said third conductor, wherein said second series LC has a second inductance L2 different than inductance L1, a second capacitance formed between said second distal end and the third conductor having a value of C2 farads, where C2 is such that an L2C2 structure is formed having an impedance essentially equal to zero at a second predetermined resonant frequency W2.

9. A multilayer support according to claim 8 wherein the C1 and C2 are such that $(L2*C2)^{-\frac{1}{2}}$ provides said second predetermined resonant frequency W2 different than said predetermined resonant frequency W0.

10. A multilayer support according to claim 8 wherein said second capacitance comprises a capacitor plate connected to the second distal end, said capacitor plate spaced apart from said third conductor by a distance D6, and having an area A2, where D6 and A2 are dimensioned to achieve the capacitance C2.

11. A resonant element in a multilayer support, said element comprising:
   a substrate having a first ground conductor arranged in a first plane, and having a second ground conductor arranged in a second plane, said second ground conductor spaced apart from said first ground conductor a distance D1 in a direction normal to said first plane; and
   N conducting vias, each of said conducting vias connected at a proximal end to said first ground conductor and having a distal end located a distance D2(n), for n=1 to N, in said normal direction, where D2(n) is less that D1, whereby each said conducting via forms a series LC between said first ground conductor and said second ground conductor, said conducting via shorting sad first ground conductor to said second ground conductor at a corresponding predetermined resonant frequency.

12. A resonant multilayer support as recited in claim 11, wherein each of said N conducting vias includes a capacitor formed between the first distal end of a corresponding one of said plurality of conducting vias and the second ground conductor.

13. A multilayer support according to claim 11, wherein each of said distances D2(n) is dimensioned to achieve a predetermined capacitance of C(n) Farads between the nth distal end and the second around conductor.

14. A multilayer support according to claim 11, wherein each of M of said N conducting vias includes a capacitor coupling plate at its distal end, each of said capacitor coupling plates having an area A(m) spaced apart from said second ground conductor by a distance D3(m), where m ranges from 1 to M and M is an integer and greater than 1.

15. A multilayer support according to claim 14, wherein each of said areas A(m) are substantially equal and each of said distances D3(m) is dimensioned to achieve a predetermined capacitance of C(m) Farads between a corresponding mth capacitor coupling plate and the second ground conductor.

16. A multilayer support according to claim 14, wherein each of said distances D3(m) are substantially equal and, each of said areas A(m) are dimensioned such that a plurality of values correspond to a plurality of predetermined resonant frequency values.

17. A multilayer support according to claim 16 wherein each of said areas A(m) are substantially equal and, each of said distances D3(m) is dimensioned to achieve a predetermined capacitance of C(m) Farads between a corresponding mth capacitor coupling plate and the second ground conductor.

18. A multilayer support according to 11, further comprising at least one connected conducting via connected to said first ground conductor and to said second ground conductor.

19. A multilayer support according to claim 11, further comprising:
 a third conductor arranged in a third plane between said first plane and said second plane and spaced from said first plane a distance D4 in said normal direction; and
 at least one connected conducting via connected to said first ground conductor and to said third conductor.

20. A method for making a low impedance LC connection between ground conducting layers in a multilayer support, said low impedance LC connection having a predetermined resonant frequency, $W_0$, said method comprising the steps of:
 forming a substrate having a first ground conductor arranged in a first plane and a second ground conductor arranged in a second plane, said second ground conductor spaced apart from said first ground conductor a distance D1 in a direction normal to said first plane; and
 forming a conducting via having a proximal end connected to the first ground conductor and having a distal end located a distance D2 in said normal direction, where D2 is less than D1, whereby said conducting via forms a series LC between said first ground conductor and said second ground conductor, said conducting via shorting said first ground conductor to said second ground conductor.

21. The method of claim 20 wherein the conducting via has an inductance LV, and a capacitance having a value CV is formed between the distal end of the via and the second ground conductor, such that an LVCV structure is formed having an impedance essentially equal to zero at said predetermined resonant frequency W0.

22. A method for making a low impedance LC connections between ground conducting layers in a multilayer support, said low impedance LC connection having predetermined resonant frequency $W_0$, said method comprising the steps of:
 forming a substrate having a first ground conducting layer arranged in a first plane and a second ground conducting layer arranged in a second plane, said second ground conducting layer spaced apart from said first ground conducting layer a distance D1 in a direction normal to said first plane;
 forming a conducting via having a proximal end connected to the first ground conducting layer and having a distal end located a distance D2 in said normal direction, where D2 is less than D1, wherein the conducting via has an inductance LV and a capacitance having a value CV forms at said distal end between said distal end and said second ground conducting layer; and
 connecting an electronic device to the first ground conducting layer, wherein the connection from the proximal end of the conducting via to the electronic device has an inductance WL.

* * * * *